United States Patent [19]
Nakano et al.

[11] Patent Number: 5,532,191
[45] Date of Patent: Jul. 2, 1996

[54] METHOD OF CHEMICAL MECHANICAL POLISHING PLANARIZATION OF AN INSULATING FILM USING AN ETCHING STOP

[75] Inventors: Tadashi Nakano; Nobuyoshi Sato; Tomohiro Ohta, all of Chiba; Hiroshi Yamamoto, Tokyo, all of Japan

[73] Assignee: Kawasaki Steel Corporation, Kobe, Japan

[21] Appl. No.: 216,410

[22] Filed: Mar. 23, 1994

[30] Foreign Application Priority Data

| Mar. 26, 1993 | [JP] | Japan | 5-068844 |
| Apr. 22, 1993 | [JP] | Japan | 5-096032 |
| Apr. 22, 1993 | [JP] | Japan | 5-096033 |
| Jun. 30, 1993 | [JP] | Japan | 5-162826 |

[51] Int. Cl.$^6$ .................................... H01L 21/3105
[52] U.S. Cl. .................... 437/228; 437/231; 437/238; 156/636.1
[58] Field of Search ................ 437/235, 238, 437/231, 228; 156/636, 645.1

[56] References Cited

U.S. PATENT DOCUMENTS

| 4,505,025 | 3/1985 | Kurosawa et al. | 29/576 W |
| 4,506,434 | 3/1985 | Ogawa et al. | 29/571 |
| 4,671,851 | 6/1987 | Beyer et al. | 156/645 |
| 4,775,550 | 10/1988 | Chu et al. | |
| 4,789,648 | 12/1988 | Chow et al. | 437/225 |
| 4,839,311 | 6/1989 | Riley et al. | 437/228 |
| 4,910,155 | 3/1990 | Cote et al. | 437/8 |
| 4,944,836 | 7/1990 | Beyer et al. | |
| 5,001,079 | 3/1991 | Van Larhovsu et al. | 437/50 |
| 5,017,513 | 5/1991 | Takguchi | 437/228 |
| 5,064,683 | 11/1991 | Poon et al. | 427/39 |
| 5,091,326 | 2/1992 | Haskell | 437/43 |
| 5,169,491 | 12/1992 | Doan. | |
| 5,187,121 | 2/1993 | Cote et al. | 437/195 |
| 5,246,884 | 9/1993 | Jaso et al. | |
| 5,294,560 | 3/1994 | Ono et al. | 437/47 |
| 5,336,640 | 8/1994 | Sato | 437/240 |
| 5,356,513 | 10/1994 | Burke et al. | 156/636 |
| 5,376,222 | 12/1994 | Miyajima et al. | 156/636 |
| 5,395,801 | 3/1995 | Dean et al. | 437/225 |
| 5,397,741 | 3/1995 | O'Connor et al. | 437/187 |
| 5,399,235 | 3/1995 | Mutsaeds et al. | 156/636 |

FOREIGN PATENT DOCUMENTS

| 60-121765 | 6/1985 | Japan | H01L 29/78 |
| 05-053255 | 1/1993 | Japan | H01L 21/90 |

OTHER PUBLICATIONS

"Low-Temperature APCVD Oxide Using TEOS-Ozone Chemistry For Multilevel Interconnections", H. Kotani et al., *Technical Digest of International Electron Device Meeting*, pp. 669–672, 1989.

"Surface Modification of Base Materials for TEOS/O$_3$ Atmospheric Pressure Chemical Vapor Deposition", K. Fujino, et al., *J. Electrochem. Soc.* vol. 139, No. 6, Jun. 1992, pp. 1690–1692.

"5000-μm Line-and-Space Planarization Using Chemical Mechanical Polishing," *Extended Abstracts of the 1993 Intl Conf on Solid State Devices and Materials* (1993), pp. 189–191.

(List continued on next page.)

Primary Examiner—R. Bruce Breneman
Assistant Examiner—Matthew Whipple
Attorney, Agent, or Firm—Oliff & Berridge

[57] ABSTRACT

A method of planarizing an insuating film includes the steps of preparing a semiconductor substrate; treating an uneven surface of the substrate with an organic solvent; forming an insulating film on the thus-treated surface of the substrate by a chemical vapor deposition using an organic silicon compound as a raw material or depositing SOG, forming an etching stop film having a chemical mechanical polishing etching speed slower than that of the insulating film by depositing silicon oxide or silicon oxynitride by performing a chemical vapor deposition using an inorganic silicon compound as a raw material; and etching back at least a part of the insulating film formed on the uneven surface of the substrate by a chemical mechanical polishing process using the etching stop film.

15 Claims, 12 Drawing Sheets

OTHER PUBLICATIONS

Wolf, 'S. Proc. for the VLSI ERA' vol. 1 (198) pp. 518, 182–185, 175, 559.

Ghandi, S., 'VLSI Fabrication Principles: Si and GaAs', 1994.

Improvement of Gap Filling . . . by Etoh Surface Treatment Sato et al., Jpn. J. Appl. Phys., vol. 32, (1993) pp. L110–L112.

"Improves Surs Micron . . . TSOS/Ozake APCVD, Korczynski et al., Microelectronics Man. Tech.," Jan. 1992.

"Planarization: Reading Between Tae Lines", Surface Tech Review, vol. 1, Iss. 8, Mar. 1990.

METHOD OF CHEMICAL MECHANICAL POLISHING PLANARIZATION OF AN INSULATING FILM USING AN ETCHING STOP

BACKGROUND OF THE INVENTION

1. Field of the Invention

The present invention relates to a method of planarizing insulating film of a semiconductor device, more particularly a method of planarizing an interlayer insulating film provided between successive metal wiring layers.

2. Related Art Statement

Recently, in the miniaturized semiconductor integrated circuit, wirings using polycrystalline silicon and aluminum alloy or the like are laminated through interlayer insulating film consisting of insulating substance, such as $SiO_2$ or the like. This interlayer insulating film is formed on a semiconductor substrate having uneven surface, i.e., protrusions and depressions on a top surface thereof caused by providing wirings on an underlayer. In this case, the insulating film is mere deposited on the substrate having wirings, the surface of the insulating film also becomes uneven in the same manner as in the substrate having uneven surface, so that fine wiring can not be formed on the interlayer insulating film, if unevenness of the surface of the interlayer insulating film is not decreased by performing any planarization treatment.

In order to perform planarization treatment, a method of etching back the insulating film formed on the substrate having uneven surface by plasma etching or chemical mechanical polishing process (hereinafter referred to as CMP process) or the like has been developed. In order to carry out this method, a method is needed for forming an insulating film having high filling capability so as to fill between fine wirings with the insulating substance completely. To this end, formation of insulating film by a chemical vapor deposition (hereinafter refer to as CVD) process using organic silicon compound such as tetraethylorthosilicate (hereinafter referred to as TEOS) or the like as a raw material is utilized. Particularly, the feature that atmospheric pressure CVD process (hereinafter, referred to as AP CVD process) using TEOS and ozone as a raw material obtains very high filling capability has been disclosed in H. Kotani et. al. Technical Digest of International Electron Device Meeting, p. 669, 1989. There is, however, a problem that the obtained insulating film has a different deposition speed in accordance with undercoating dependency, that is, the material of undercoating. In order to remove the undercoating dependency, the feature that at first, an insulating film is deposited by a plasma CVD method, and then, another insulating film is deposited by AP CVD method using TEOS and ozone as a raw material, has also been disclosed in H. Kotani et al. Technical Digest of International Electron Device Meeting, p. 669, 1989. Moreover, a method of treating the surface of insulating film deposited by plasma CVD process with the plasma of $N_2$ and/or $NH_3$ has been disclosed in K. Fujino et. al. J. Electrochem. Soc., Vol. 139, No. 6, June, 1992, pp.1690–1692. A method that the substrate surface is treated with organic solvent such as ethanol or the like to improve the filling capability and the quality of the insulating film formed by CVD using organic silicon compound as a raw material has been disclosed in U.S. patent application Ser. No. 08/034,748. A method that the solvent of the insulating film substance or its precursor is applied on the substrate, and then heating treatment is performed with proper temperature, thereby forming an insulating film, that is to say, a spin on glass (hereinafter, referred to as SOG) process has been well known as a method of fabricating insulating film having superior filling capability. For example, a method of planarizing the surface of the insulating film by an etching back using SOG and plasma etching has been disclosed in U.S. Pat. No. 4,775,550.

In case of performing the etching back by using CMP process, as disclosed in U.S. Pat. No. 5,169,491, an etching stop has to use in order to overcome the problem of insufficient controllability of etching amount. A method of etching back borophosphosilicate glass (hereinafter, referred to as BPSG) film by using $SiO_2$ film as an etching stop has been disclosed in U.S. Pat. No. 5,169,491 and S. Kishi et al., Technical Abstracts of the 1993 International Conference on Solid State Devices and Materials, Makuhari, 1993, pp. 189–191. A method of etching back $SiO_2$ film by using $Si_3N_4$ film as an etching stop has been disclosed in U.S. Pat. No. 4,944,836. A method of etching back $SiO_2$ by using diamond-like carbon as an etching stop has been disclosed in U.S. Pat. No. 5,246,884. However, suitable material of etching stop for etching back with CMP process the insulating film formed by CVD using the above organic silicon compound as a raw material or the SOG process has not been disclosed in any reference.

SUMMARY OF THE INVENTION

It is an object of the present invention to resolve the above described problems of the method of planarizing the insulating film.

It is another object of the present invention to provide a method of planarizing the insulating film, in which surface dependency of the undercoating is resolved by the solution of organic compound and pattern dependency is resolved by CMP, thereby obtaining an interlayer insulating film having superior film quality, superior filling capability and substantially complete planarization.

According to the present invention, there is provided a method of planarizing an insulating film comprising steps of:

(a) preparing a semiconductor substrate;

(b) treating an uneven surface of the substrate with an organic solvent;

(c) forming an insulating film on the thus treated surface of the substrate by a CVD using an organic silicon compound as a raw material; and (d) etching back at least a part of the insulating film formed on the uneven surface of the substrate by a material removing treatment.

In an embodiment of the method according to the present invention, the method further comprises a step of forming a film by SOG process on the surface of the substrate before the step of treating an uneven surface of the substrate with an organic solvent.

In a preferable embodiment of the method according to the present invention, the insulating film is formed by a chemical vapor deposition using TEOS and ozone as a raw material. The step of treating an uneven surface of the substrate with an organic solvent is performed by using an organic solvent including ethanol. The step of etching back at least a part of the insulating film formed on the uneven surface of the substrate by a material removing treatment is performed by using a CMP process.

In a further preferable embodiment of method according to the present invention, the method further comprising a step of forming a film having a CMP etching speed slower than that of the insulating film on or under thereof, and the CMP is performed by using the film having slower etching speed as an etching stop. The film having slower etching speed by the CMP is formed by depositing either silicon oxide or silicon oxide nitride with CVD including an inorganic silicon compound as a raw material.

In a further preferable embodiment of the method according to the present invention, the insulating film is formed by a CVD using TEOS and ozone as a raw material. The step treating an uneven surface of the substrate with an organic solvent is performed by using an organic solvent including ethanol. The substrate is formed by including a step of patterning a film laminated by depositing the film having slower etching speed on a metal film including either one of Al, Cu and Au. The insulating film is formed after the film having slower etching speed is formed on the substrate. The film having slower etching speed is formed on the substrate after the insulating film is formed.

According to another aspect of the present invention, there is provided a method of planarizing a insulating film comprising steps of:

(a) preparing a semiconductor substrate;

(b) forming insulating film on an uneven surface of the substrate by performing a CMP using an organic silicon compound as a raw material or by SOG process; and (c) etching back at least a part of the insulating film formed on the uneven portion of the substrate by using the CMP.

In a preferable embodiment of the device according to the present invention, the device further comprises a step of forming a film having a CMP etching speed slower than that of the insulating film on or under thereof, and the CMP is performed by using the film having slower etching speed as an etching stop.

In a further preferable embodiment of the device according to the present invention, the film having slower etching speed by the CMP is formed by depositing either silicon oxide or silicon oxide nitride with CVD including an inorganic silicon compound as a raw material. The insulating film is formed by a CVD using TEOS or TEOS and ozone as a raw material. The substrate is formed by including a step of patterning a film laminated by depositing the film having slower etching speed on a metal film including either one of Al, Cu and Au.

In a further preferable embodiment of the device according to the present invention, the insulating film is formed after the film having slower etching speed is formed on the substrate. The film having slower etching speed is formed on the substrate after the insulating film is formed.

DETAILED EXPLANATION OF THE PREFERRED EMBODIMENT

Figure 1A:
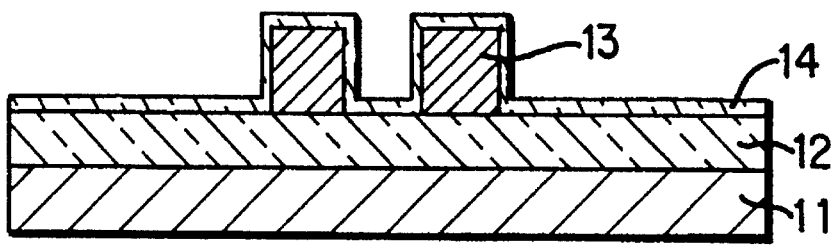
FIGS. 1a to 1d are cross sectional views showing first embodiment of the method according to the present invention.

Now to the drawings, there are shown various embodiments of a method of planarizing insulating film according to the present invention. Like parts are shown by corresponding reference characters throughout several views of the drawings.

Embodiment 1

FIGS. 1a to 1d are cross sectional views showing first embodiment of a method of planarizing insulating film according to the present invention.

As shown in FIGS. 1a to 1d, a BPSG film 12 is deposited on a semiconductor wafer 11 on which a structure (not shown) required as a semiconductor integrated circuit, such as a MOS transistor and an isolating oxide film or the like is formed thereon, by APCVD, and then thus formed wafer 11 is subjected to a heating treatment of 850° C., thereby forming a semiconductor substrate. Then, a Ti film having a thickness of 20 nm, a TiN film having a thickness of 100 nm, an Al-0.5 wt % Cu alloy film having a thickness of 750 nm, and a TiN film having a thickness of 30 nm are laminated on the thus formed substrate in this order by a sputtering process, thereby forming a laminated metal film. This laminated metal film is subjected to a conventional photolithography and a dry etching process to form aluminum wirings 13 having various widths and spaces. A nondoped silicate glass (hereinafter, referred to as NSG) film 14 having a thickness of 50 nm at its planarized portion is deposited by plasma CVD using TEOS and oxygen as a raw material on the thus formed substrate (FIG. 1a). This NSG film 14 is hereinafter referred to as a p-TEOS NSG film.

Figure 1B:
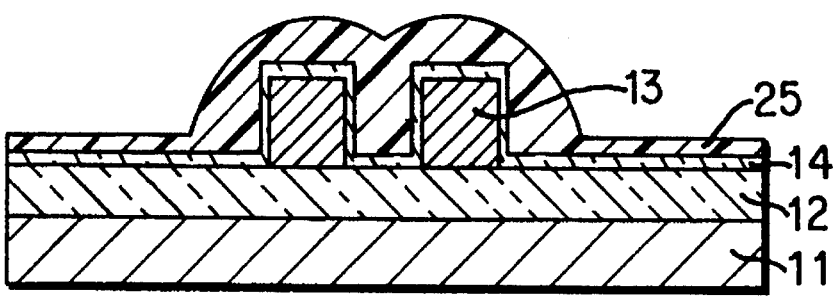

Thus formed substrate has uneven surface, i.e., has protrusions and depressions on its top surface. This uneven surface of the substrate is subjected to a surface treatment with ethanol. Concretely, the silicon wafer is placed on a spin coater (not shown) and ethanol of 3 ml is dropped on the substrate, while rotating the spin coater at 3000 r.p.m., and dried by holding it for 3 minutes as it is. Then, an NSG film 25 is deposited on the thus formed substrate by APCVD using TEOS and ozone as a raw material under the condition that this NSG film has a thickness of 500 nm if it is directly deposited on a silicon substrate. This NSG film 25 is hereinafter referred to as ozone-TEOS NSG film. In this case, the ozone-TEOS NSG film 25 has a thickness of 450 nm on the top portions of the wirings which are closely provided and a thickness of 50 nm on the planarized portion on which wirings are not provided (FIG. 1b). In this case, the deposition condition is as follows.

| deposition temperature: | 400° C. |
|---|---|
| deposition pressure: | atmospheric pressure |
| nitrogen supply rate to gas bubbler: | 1.5 l/min |
| temperature of thermostat: | 65° C. |
| oxygen supply rate to ozonizer: | 7.5 l/min |
| ozone concentration: | 120 g/m$^3$ |
| supply rate of carrier nitrogen: | 18 l/min |

Ozone-TEOS NSG film has very high filling capability and can be filled between wirings completely, even if the wiring space is 0.3 μm, i.e. it is made fine up to aspect ratio (ratio between wiring height and wiring space) of 3.0. The more the p-TEOS NSG film 14 is thicker, the more the portion of the ozone-TEOS NSG film 25 to be filled is narrower than the wiring space, and thus the effective aspect ratio becomes substantially increased, resulting in a hardness of filling. Therefore, the thickness of the p-TEOS NSG film 14 is made 150 nm or less, preferably made less than 50 nm.

Figure 1C:
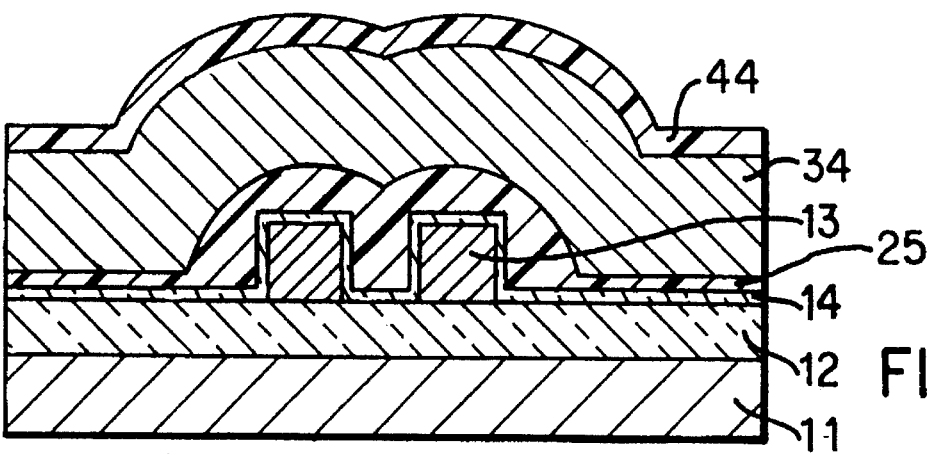

Then, a p-TEOS NSG film 34 having a thickness of 1.5 μm at the planarized portion thereof is deposited on the ozone-TEOS NSG film 25, and then a silicon oxide film 44 having a thickness of 0.2 μm at the planarized portion thereof is deposited on the p-TEOS NSG film 34 by plasma CVD process using SiH$_4$ and N$_2$O as a raw material. This silicon oxide film 44 is, hereinafter, referred to as p-SiH$_4$ SiO$_2$ film (FIG. 1c).

Then, the p-SiH$_4$ SiO$_2$ film 44 and the p-TEOS NSG film 34 which are placed on the convex portion of the substrate are etched back by CMP process. CMP conditions are shown in following Table I.

TABLE 1

| Pad | IC-60 |
|---|---|
| Slurry | SC112 |
| Pressure | 1.3 bar |
| Rotation Speed | 45 rpm |

Figure 1D:
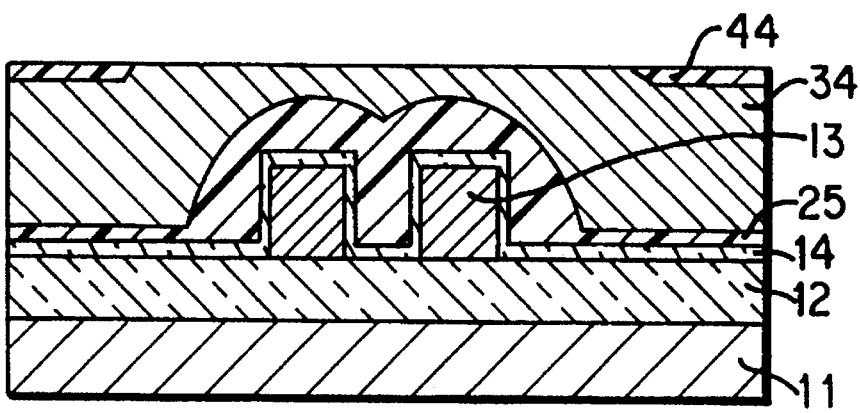

In these conditions, the etching speed of p-SiH$_4$ SiO$_2$ film and p-TEOS NSG film which are deposited on the substrate having no uneven surface thereof are compared. It was found that etching speed of the latter was faster than that of the former by about three times. Therefore, at immediately after CMP beginning, high pressure is partially applied to the convex portion, so that the p-SiH$_4$ SiO$_2$ film 44 formed on the convex portion is etched away, and then the p-TEOS NSG film 34 on the convex portion is etched away. However, the p-SiH$_4$ SiO$_2$ film 44 formed on the concave portion thereof, is almost not etched away. Therefore, when the p-TEOS NSG film 34 formed on the convex portion is removed and the surface thereof is planarized, the pressure applied to the surface of the p-TEOS NSG film 34 becomes weak because of the presence of the p-SiH$_4$ SiO$_2$ film 44 having slower etching speed, so that the etching of the p-TEOS NSG film 34 hardly progresses. Therefore, by setting preferred etching time, the interlayer insulating film having planarized surface can be obtained as shown in FIG. 1(d).

Usable organic solvent or compound rather than ethanol are shown as follows.

Mention may be made of aliphatic saturated monoalcohols (OH group) such as methanol, (ethanol), 1-propanol, 2-propanol, 1-butanol, 2-methyl-1-propanol, 2-butanol, 2-methyl-2-propanol, 1-pentanol, 3-methyl-1-butanol, 3-methyl-2-butanol, 2-methyl-2-butanol, 1-hexanol, cyclohexanol and the like; aliphatic unsaturated monoalcohols (OH group) such as allyl alcohol, propargyl alcohol, 2-methyl-3-butyn-2-ol and the like; aromatic alcohols (OH group) such as benzyl alcohol, furfuryl alcohol and the like; aliphatic saturated polyalcohols and their derivatives (OH group) such as ethylene glycol, propylene glycol, diethylene glycol, ethylene glycol monomethyl ether, ethylene glycol monoethyl ether, ethylene glycol mono-n-butyl ether, ethylene glycol monoisobutyl ether, propylene glycol monomethyl ether, ethylene glycol dimethyl ether, diethylene glycol monomethyl ether, diethylene glycol monoethyl ether, diethylene glycol dimethyl ether and the like; aldehydes (CO group) such as formaldehyde, acetaldehyde, glyoxal and the like; ethers (COC group) such as diethyl ether, dioxane, tetrahydrofuran, tetrahydrofurfuryl alcohol and the like; ketones and ketoalcohols (CO group) such as acetone, 2-butanone, diacetone alcohol, γ-butyrolactone, propylene carbonate and the like; carboxylic acids (CO group) such as formic acid, acetic acid, propionic acid, glycolic acid, lactic acid, ethyl lactate and the like; nitroalkanes (NO$_2$ group) such as nitromethane, nitroethane, nitropropane, nitrobenzene and the like; amines (NR$_2$:R=H or alkyl group) such as ethylamine, propylamine, isopropylamine, butylamine, isobutylamine, allylamine, aniline, toluidine, ethylene diamine, diethylamine, ethylene imine, dipropylamine, diisopropylamine, dibutylamine, triethylamine, tri-n-propylamine, tri-n-butylamine and the like; acylnitriles (CN group) such as acetonitrile, propionitrile, butyronitrile, acrylonitrile, methacrylonitrile, benzonitrile and the like; acid amides (NR$_2$:R=H or alkyl group) such as formamide, N-methyl formamide, N,N-dimethyl formamide, acetamide, N-methyl acetamide, N,N-dimethyl acetamide, tetramethylurea, ε-caprolactam and the like; and heterocyclic compounds such as pyridine, quinoline, pyrrole, piperidine, piperazine, morpholine, 2-pyrrolidinone, 1-methyl-2-pyrrolidinone and the like.

In addition to spin-coat treatment in which the organic compound is applied while spinning a semiconductor wafer, as a surface treatment with organic solvent, there are a vapor treatment in which a vapor of an organic compound is blown onto a semiconductor wafer, an immersion treatment in which a semiconductor wafer is immersed in a solution of an organic compound, a spray treatment in which a solution of an organic compound is sprayed onto a semiconductor wafer, a curtain flow coat treatment in which a semiconductor substrate is passed through a down flow stream of an organic compound, or the like.

Usable organic silicon compound rather than TEOS are shown as follows.

Mention may be made of tetraalkoxysilanes (orthosilicic acid esters) such as tetramethoxysilane, tetraethoxysilane, tetra-n-propoxysilane, tetra-isopropoxysilane, tetra-n-butoxysilane; trialkoxysilanes such as trimethoxysilane, triethoxysilane, tri-n-propoxysilane, triisopropoxysilane, tri-n-butoxysilane; alkylalchoxysilanes such as methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, phenyltrimethoxysilane, dimethyldimethoxysilane, dimethyldiethoxysilane, diethyldimethoxysilane, diethyldiethoxysilane, diethyldi-n-propoxysilane, ethyldiisopropoxysilane, methylvinyldimethoxysilane, methylvinyldiethoxysilane, methyldiethoxysilane, methyldiethoxysilane, dimethylvinylethoxysilane, dimethylvinylethoxysilane; polysiloxanes such as tetrakis(dimethylsiloxy)-silane; cyclosiloxanes such as octamethylcyclotetra-siloxane, pentamethylcycotetrasiloxane, tetra-methylcyclotetrisiloxane, hexamethylcyclotrisiloxane, trimethylcyclotrisiloxane; disiloxanes such as hexamethyldisiloxane, tetramethyldimethoxydisiloxane, dimethyltetramethoxy-disiloxane, hexamethoxydisiloxane; alkylsilanes such a monomethylsilane, dimethylsilane, trimethylsilane, tetramethylsilane, tetraethylsilane, triethylsilane, allyltrimethylsilane, hexamethyldisilane; silylamines such as diethyltrimethylsilylamine, dimethyltrimethylsilylamine; nitrogen derivatives of silane such as aminopropyltriethoxysilane, trimethylsilylazide, trimethylsilylcyanide; silazanes such as hexamethyldisilazane, tetramethyldisilazane, octamethylcyclotetrasilazane, hexamethylcyclotrisilazane; and halogenated silanes and their derivatives such as trimethylchlorosilane, triethylchlorosilane, tri-n-propylchlorosilane, methyldichlorosilane, dimethylchlorosilane, chloromethyldimethylchlorosilane, chloromethyltrimethylsilane, chloropropylmethyldichlorosilane, chloropropyltrimethoxysilane, dimethylichlorosilane, diethyldichlorosilane, methylvinyldichlorosilane, methyltrichlorosilane, ethyltrichlorosilane, vinyltrichlorosilane, trifluoropropyltrichlorosilane, trifluoropropyltrimethoxysilane, trimethylsilyliodide and a mixture thereof. In the mixture, a mixing ratio may be optional.

It is also possible to deposit phosphosilicate glass film by mixing organic phosphorus compound such as trimethylphosphate and the like or to deposit BPSG film by mixing organic boron compound such as trimethylborate and the like.

In this case, when the surface treatment using ethanol is performed and the insulating film is formed by AP CVD using TEOS and ozone as a raw material, most favorable film quality and filling capability can be realized. It is also possible to make the deposition pressure more than or less than an atmospheric pressure. In this case, it is preferable that the deposition is performed with the pressure of more than 600 torr in order to obtain excellent filling capability and excellent film quality.

As a raw material rather than usable $SiH_4$ in order to deposit silicon oxide film, there are $Si_2H_6$, $Si_3H_8$ or the like. Moreover, silicon oxide film deposited by APCVD using $SiH_4$ and $O_2$ as a raw material can also be utilized. By utilizing silicon oxynitride film using $SiH_4$, $N_2O$, and $NH_3$ as a raw material, etching speed difference between the oxynitride film and p-TEOS NSG film is made large and a process window can be made wide.

As a usable etching stop material rather than silicon oxide, silicon oxynitride, there are silicon nitride, alumina or the like. In this case, these material have large stress, so that it is capable of causing failure of wiring. Diamond-like carbon deposited by CVD process can also be utilized as an etching stop. This material has conductive property, so that it must be removed after planarizing step. High melting point metal such as Ti, W, Ta or the like, and high melting point metal compound such as TiN, TiB, WN or the like can also be utilized, but these metal and metal compound must be removed after planarizing step.

Embodiment 2

Figure 2A:
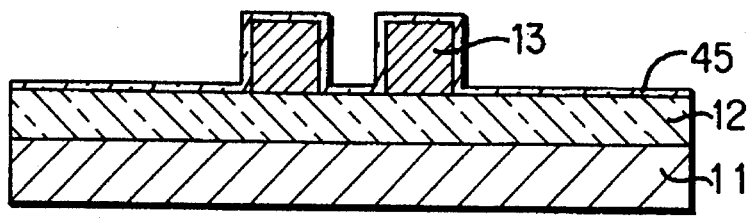
FIGS. 2a to 2d are cross sectional views showing second embodiment of the method according to the present invention.

In this embodiment, after forming aluminum wiring in the same manner as in the embodiment 1, an SOG film 45 is deposited on a semiconductor wafer or substrate so as to have film thickness of 20 nm at its planarized portion. In this case, a solution of 0.5 to 5% of silanol oligomer formed by hydrolyzing and poly-condensing orthosilicic acid esters is applied onto the BPSG film 12, and subjected to a heating process to 400° C. for 30 minutes, thereby forming the SOG film (FIG. 2a).

Figure 2B:
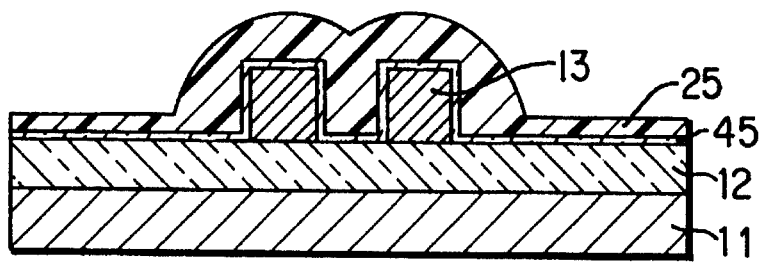
Figure 2C:
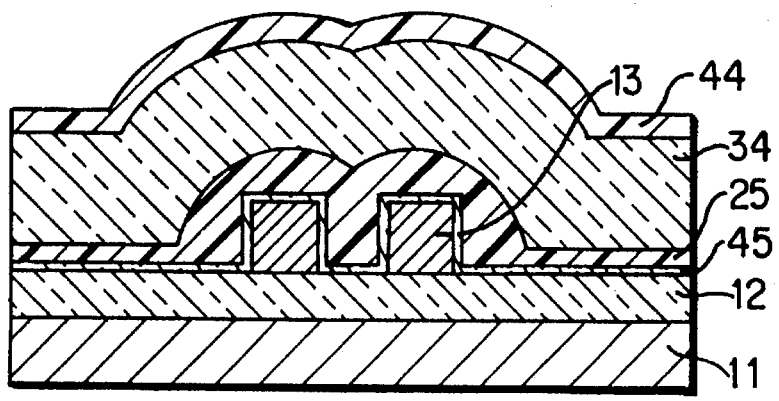
Figure 2D:
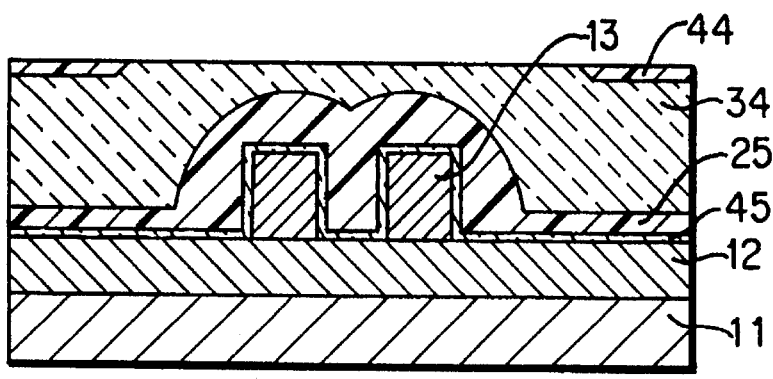

The surface of thus formed substrate is subjected to ethanol treatment, an ozone-TEOS NSG film 25 is deposited (FIG. 2b), a p-TEOS NSG film 34 and a p-$SiH_4$ $SiO_2$ film 44 are deposited (FIG. 2c) and a CMP process is performed and then an interlayer insulating film having planarized surface a shown in FIG. 2d is obtained by the same processes as in the case of the embodiment 1.

According to this embodiment, the SOG film 45 is formed and its surface is subjected to a surface treatment, so that as compared with the case of the embodiment 1, superior reproducibility is obtained and undercoating dependency is completely prevented.

It is preferable to make SOG thickness less than 150 nm, preferably less than 50 nm. It is preferable in order to form thin SOG film having superior uniformity to make concentration of silanol oligomer low, for example, less than 1%, so that very thin SOG film 45 can be formed as compared with the p-TEOS NSG film 14 obtained in the embodiment 1, thereby enabling filling between more fine wirings by ozone-TEOS NSG film 25.

Embodiment 3

Figure 3A:
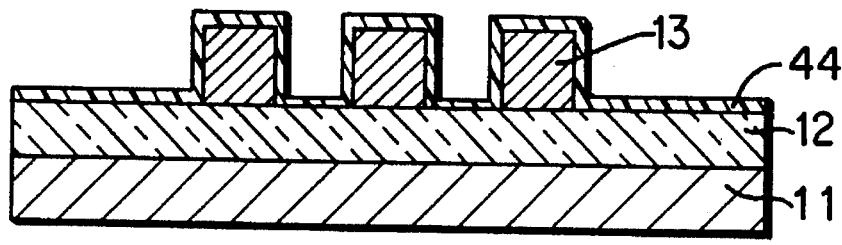
FIGS. 3a to 3d are cross sectional views showing third embodiment of the method according to the present invention.

In this embodiment, after an aluminum wiring 13 is formed in the same manner as in the embodiment 1, a p-$SiH_4$ $SiO_2$ film 44 is deposited on a semiconductor wafer or substrate so as to have film thickness of 100 nm at its planarized portion (FIG. 3(a)). The p-$SiH_4$ $SiO_2$ film 44 serves as an etching stop.

Figure 3B:
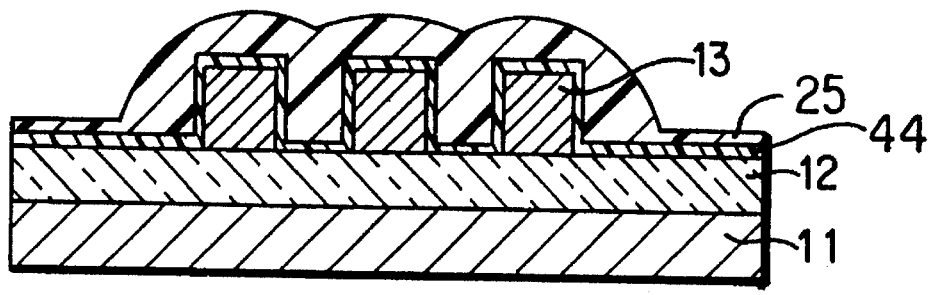

The surface of the p-$SiH_4$ $SiO_2$ film 44 is then treated with ethanol, and the ozone-TEOS NSG film 25 is deposited in the same manner as in the embodiment 1 (FIG. 3(b)).

Figure 3C:
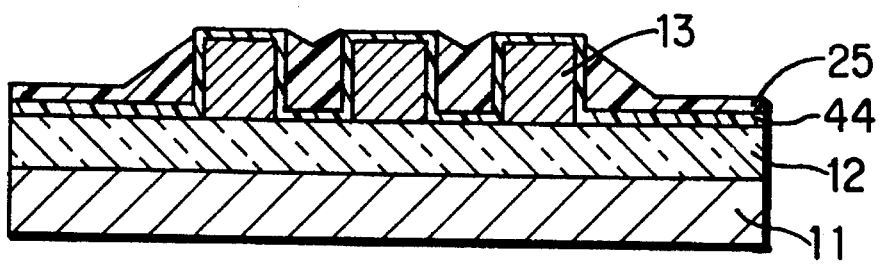

Then, convex portion i.e., the portion of the ozone-TEOS NSG film 25 on the aluminum wiring is etched back with CMP process. In this case, the etching speed of the ozone-TEOS NSG film 25 is substantially the same as that of the p-TEOS NSG film, so that the etching speed of p-$SiH_4$ $SiO_2$ film is about ⅓ of that of ozone-TEOS NSG film. Therefore, the etching hardly progresses at the time of exposing the p-$SiH_4$ $SiO_2$ film 44 on the aluminum wiring 13, thereby obtaining a structure as shown in FIG. 3(c). If the p-$SiH_4$ $SiO_2$ film 44 is not provided or a p-TEOS NSG film is utilized instead of the p-$SiH_4$ $SiO_2$ film 44, etching can not be stopped under the shown state and thus aluminum wiring 13 is exposed, resulting in a resistance increase of the aluminum wiring 13 and a failure of discontinuation of wiring or the like.

Figure 3D:
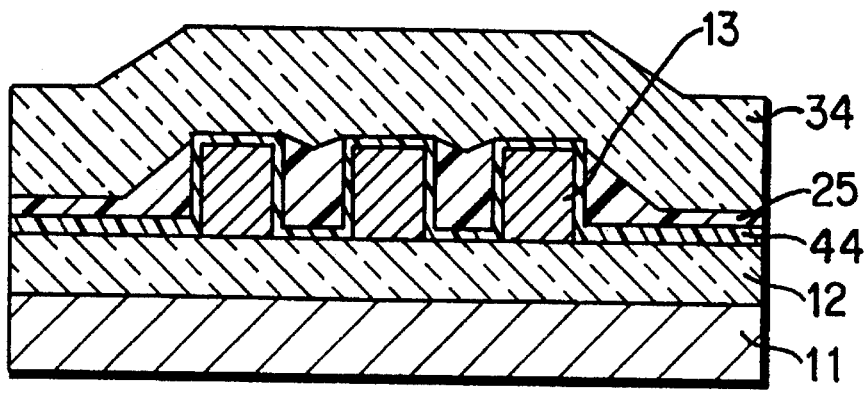

Finally, a p-TEOS NSG film 34 having a thickness of 0.8 µm is deposited, and thus a step of forming interlayer insulating film is finished (FIG. 3d).

In this case, the ozone-TEOS NSG 25 could completely be filled between wirings having space of 0.45 µm. If the p-$SiH_4$ $SiO_2$ film 44 is made further thin, the ozone-TEOS NSG 25 can be filled between more fine wirings, but this p-$SiH_4$ $SiO_2$ film 44 serves an etching stop for CMP process, so that thinning of the p-$SiH_4$ $SiO_2$ film 44 leads to a narrowing of process window of CMP process.

The p-TEOS NSG film 34 may be etched back so as to further planarize the surface thereof.

Embodiment 4

Figure 4A:
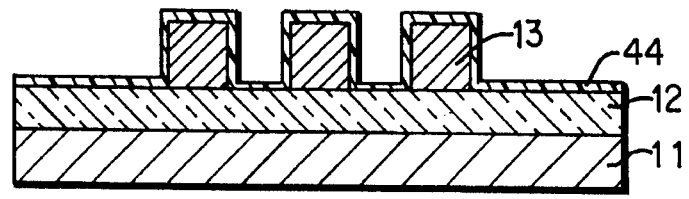
FIGS. 4a to 4e are cross sectional views showing fourth embodiment of the method according to the present invention.
Figure 4B:
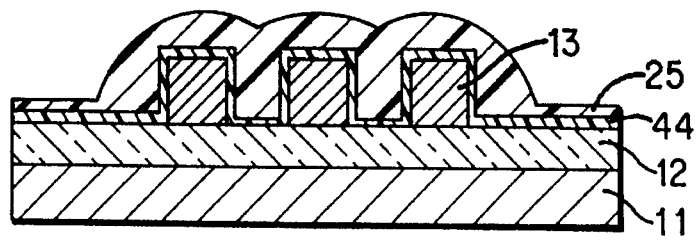

In this embodiment, the steps of forming the aluminum wiring 13, depositing the p-SiH$_4$ SiO$_2$ film 44 (FIG. 4a), and depositing the ozone-TEOS NSG 25 by performing ethanol surface treatment (FIG. 4b), are the same as the step of the embodiment 3.

Figure 4C:
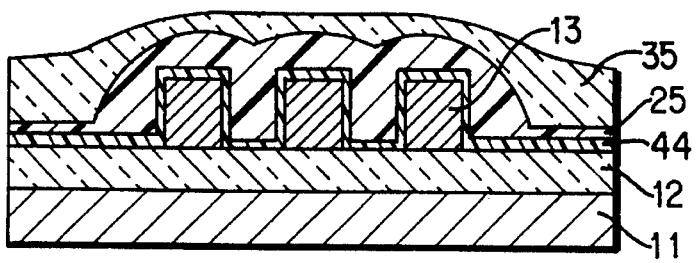

Then, an SOG film 35 is deposited on the ozone-TEOS NSG 25 so as to have film thickness of 1 μm at its planarized portion (FIG. 4c).

Figure 4D:
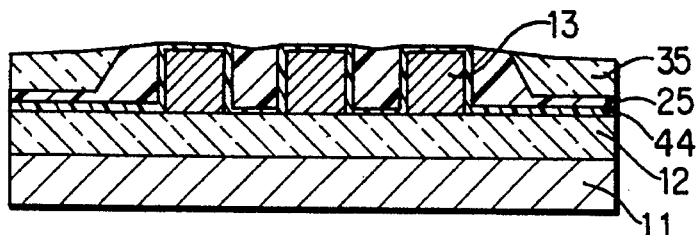

The surface of thus formed semiconductor wafer is etched back by CMP process. The etching speed of SOG film 35 is near the etching speed of p-TEOS NSG film, so that the SOG film 35 can be etched back with the same speed as that of p-TEOS NSG film, while holding etching speed ratio to that of the p-SiH$_4$ SiO$_2$ film 44. Therefore, the p-SiH$_4$ SiO$_2$ film 44 is used as an etching stop in the same manner as in the case of the embodiment 3, so that as shown in FIG. 4d, etching can be stopped at the time that the convex portion thereof, i.e., the portions of the SOG film 35 and the ozone-TEOS NSG 25 which are placed on the aluminum wiring 13 are etched back and the p-SiH$_4$ SiO$_2$ film 44 is exposed. In this case, the surface of the SOG film 35 at the concave portion before CMP process is started is higher than the surface of the p-SiH$_4$ SiO$_2$ film 44 on the aluminum wiring 13 by 150 nm, so that the surface portion of the SOG film 35 at the concave portion is also etched back and then etching is stopped in the slightly down state as compared with the surface of the p-SiH$_4$ SiO$_2$ film 44 on the aluminum wiring 13.

Figure 4E:
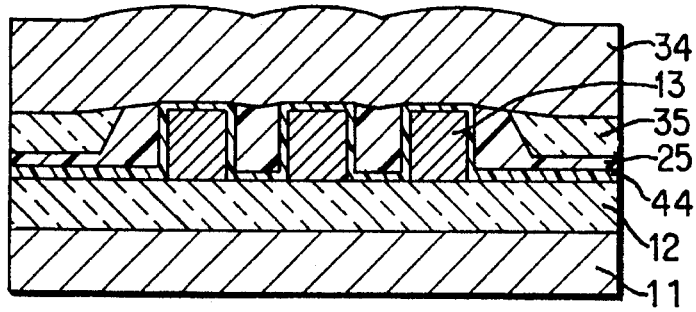

Finally, a p-TEOS NSG film 34 having a thickness of 0.8 μm is deposited, and thus a step of forming interlayer insulating film is finished (FIG. 4e).

This embodiment 4 has a longer process than that of the embodiment 3, but the interlayer insulating film having higher planarizing capability can be obtained.

Embodiment 5

Figure 5A:
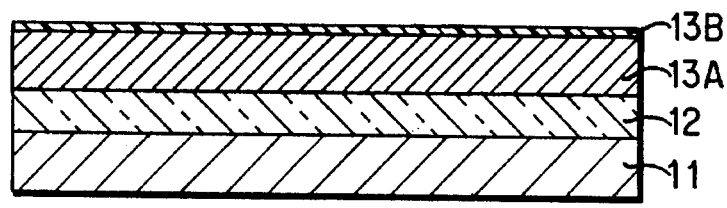
FIGS. 5a to 5e are cross sectional views showing fifth embodiment of the method according to the present invention.
Figure 5B:
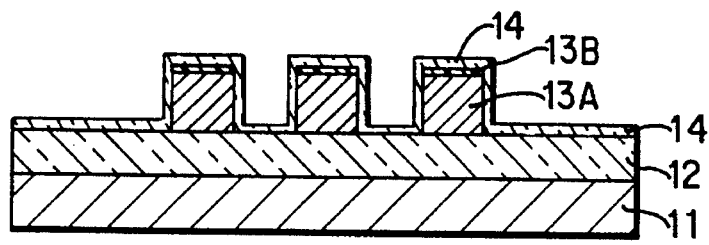

In this embodiment, a BPSG film 12 is deposited onto a semiconductor wafer, and after performing a heat treatment, a laminated metal film 13a consisting of an aluminum alloy film and having the same construction as that of the embodiments 1 to 4 is deposited on the BPSG film 12 by a sputtering process and then a p-SiH$_4$ SiO$_2$ film 13b having a thickness of 100 nm is deposited onto the metal film 13a (FIG. 5a). Then, a film of laminated metal film 13a and p-SiH$_4$ SiO$_2$ film 13b is patterned to required pattern, thereby forming aluminum wiring 13 having p-SiH$_4$ SiO$_2$ film 13b laminated on the metal film 13a at upper portion thereof (FIG. 5b).

Figure 5C:
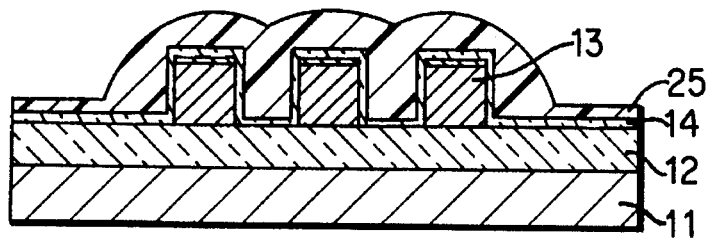

Then, a p-TEOS NSG film 14 having a thickness of 50 nm at its planarized portion is deposited on the thus formed wafer (FIG. 5b), the surface of the p-TEOS NSG film 14 is subjected to an ethanol surface treatment, and then, an ozone-TEOS NSG 25 is deposited onto the p-TEOS NSG film 14 under the same conditions as those of the embodiment 1 (FIG. 5c).

Then, the convex portion, i.e., the portion of the ozone-TEOS NSG 25 on the aluminum wiring 13 is etched back by CMP process.

Figure 5D:
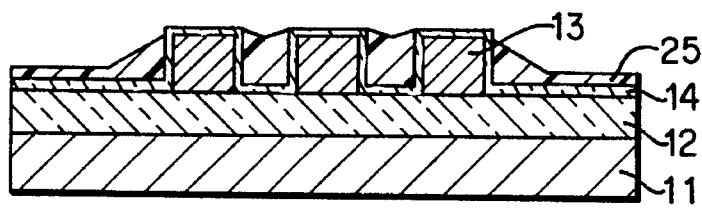

In this case, the p-SiH$_4$ SiO$_2$ film 13b on the aluminum wiring 13 serves as an etching stop, and thus etching is stopped under the state shown in FIG. 5d.

Figure 5E:
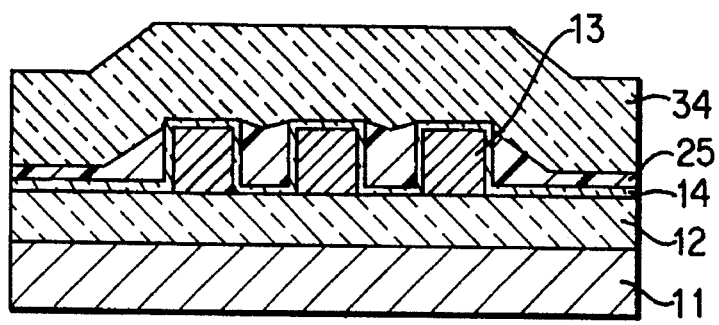

Finally, a p-TEOS NSG film 34 having a thickness of 0.8 μm is deposited, and thus a step of forming interlayer insulating film is finished (FIG. 5e).

The p-TEOS NSG film 14 used in this embodiment does not serve as an etching stop, and can be made thin as compared with the p-SiH$_4$ SiO$_2$ film 44 used in the embodiment 3, so that the ozone-TEOS NSG 25 can be filled between more fine wirings. In practice, the ozone-TEOS NSG 25 could be completely filled between wirings having line space of 0.35 μm. The more the thickness of p-SiH$_4$ SiO$_2$ film 13b becomes thick, the more the height of the aluminum wiring 13 becomes high, so that even if line spaces are the same with each other, an aspect ratio becomes high and thus, line space capable of filling becomes wide. On the one hand, when the thickness of the p-SiH$_4$ SiO$_2$ film 13a becomes thin, the effect of etching stop becomes decreased and thus the process window becomes narrow.

Embodiment 6

Figure 6A:
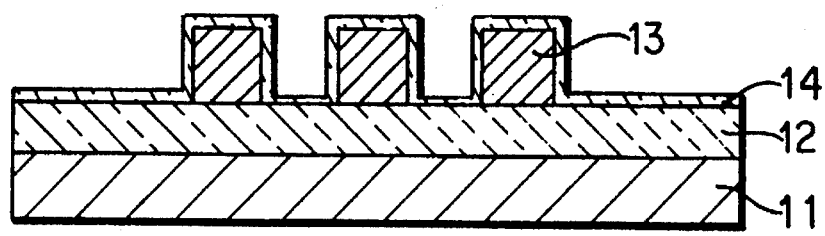
FIGS. 6a to 6d are cross sectional views showing sixth embodiment of the method according to the present invention.
Figure 6B:
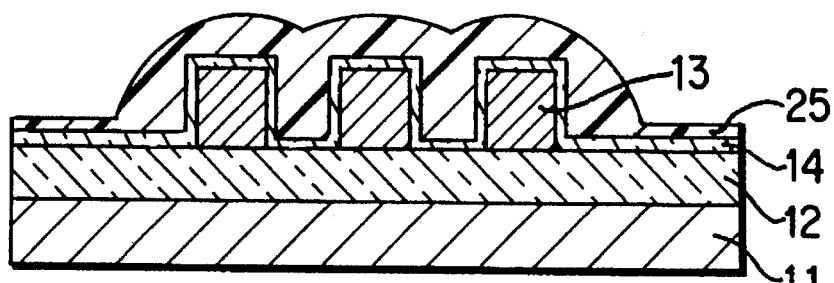

In this embodiment, the steps of forming the aluminum wiring 13, depositing the p-TEOS NSG film 14 (FIG. 6a), and depositing the ozone-TEOS NSG 25 by performing ethanol surface treatment (FIG. 6b), are the same as the step of the embodiment 1.

Figure 6C:
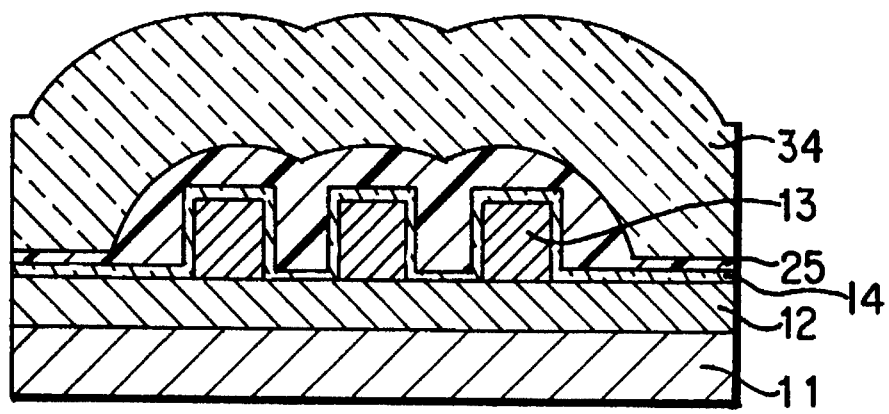
Figure 6D:
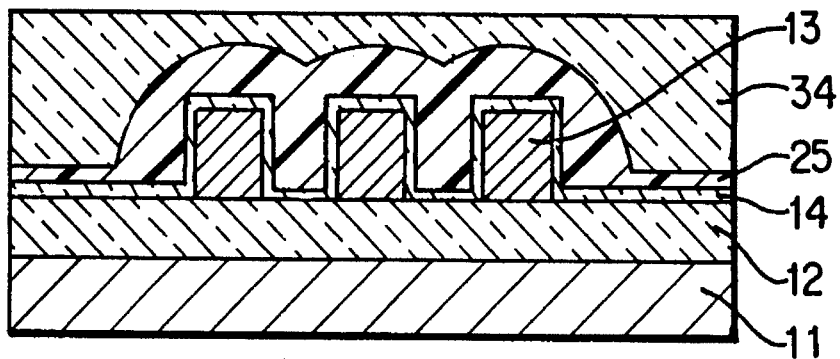

Then, a p-TEOS NSG film 34 having a thickness of 1.7 μm at its planarized portion is deposited (FIG. 6(c)) and the convex portion, i.e., the p-TEOS NSG film 34 on the aluminum wiring 13 is etched back by CMP process, thereby obtaining a planarized interlayer insulating film (FIG. 6(d)). The etching back is performed by setting etching time so as to make a thickness of the p-TEOS NSG film 34 being 1.6 μm at its planarized portion.

If CMP technique is improved and sufficient controllability can be obtained without using the etching stop, the planarization of insulating film can be performed with short step as compared to the embodiment 1.

Embodiment 7

Figure 7A:
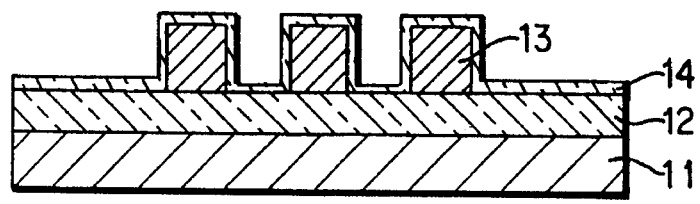
FIGS. 7a to 7e are cross sectional views showing seventh embodiment of the method according to the present invention.
Figure 7B:
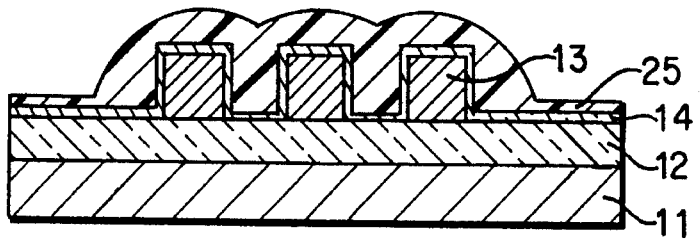

In this embodiment, the steps of forming the aluminum wiring 13, depositing the p-TEOS NSG film 14 (FIG. 7a), and depositing the ozone-TEOS NSG 25 by performing ethanol surface treatment (FIG. 7b), are the same as the step of the embodiment 1.

Figure 7C:
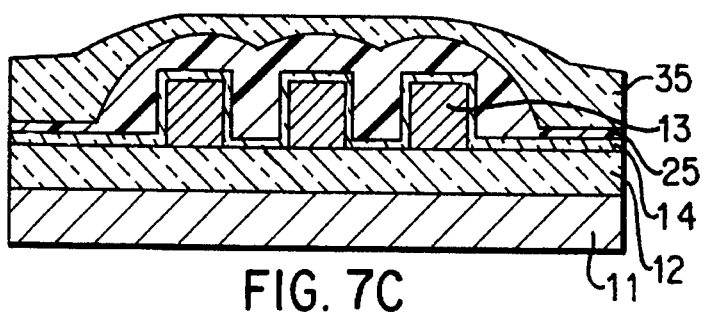
Figure 7D:
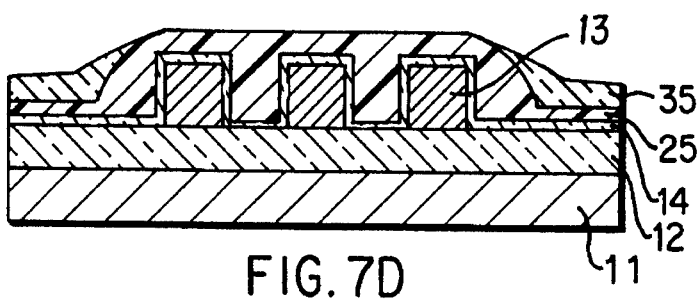

Then, an SOG film 35 is deposited on the ozone-TEOS NSG 25 so as to have film thickness of 1 μm at its planarized portion (FIG. 7(c)).

Figure 7E:
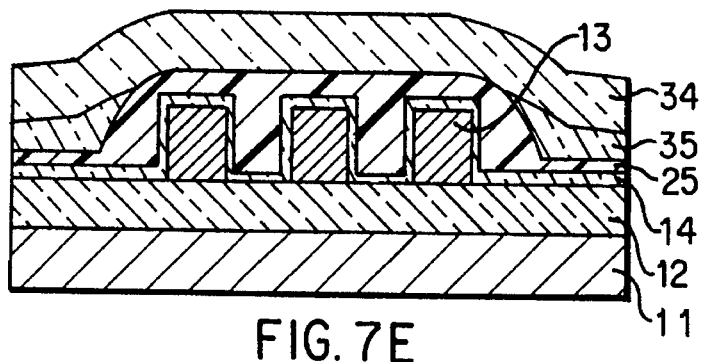

Then, by utilizing a plasma etching using a gas atmosphere containing fluorine and oxygen, the thus obtained wafer is subjected to an etching back process under the condition that the ozone-TEOS NSG 25 and the SOG film 35 are etched with substantially the same etching speed (FIG. 7e). The etching back is performed by setting the etching time so as to make a thickness of the SOG film 35 being 0.4 μm at its planarized portion.

Finally, a p-TEOS NSG film 34 having a thickness of 0.5 μm is deposited, and thus a step of forming interlayer insulating film is finished (FIG. 7e).

This embodiment is inferior in planarization of interlayer insulating film as compared with the embodiment 1, but can be realized without using CMP process having less result in mass production.

Embodiment 8

Figure 8A:
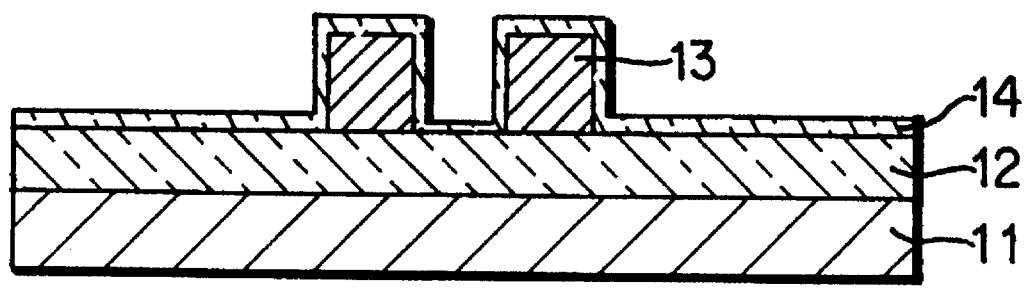
FIGS. 8a to 8e are cross sectional views showing eighth embodiment of the method according to the present invention.
Figure 8B:
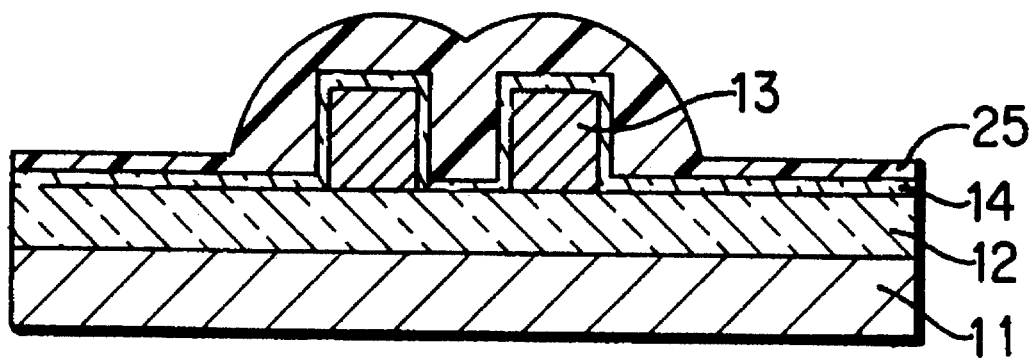

In this embodiment, the steps of forming the aluminum wiring 13, depositing the p-TEOS NSG film 14 (FIG. 8a), and depositing the ozone-TEOS NSG 25 by performing ethanol surface treatment (FIG. 8b), are the same as the step of embodiment 1.

Figure 8C:
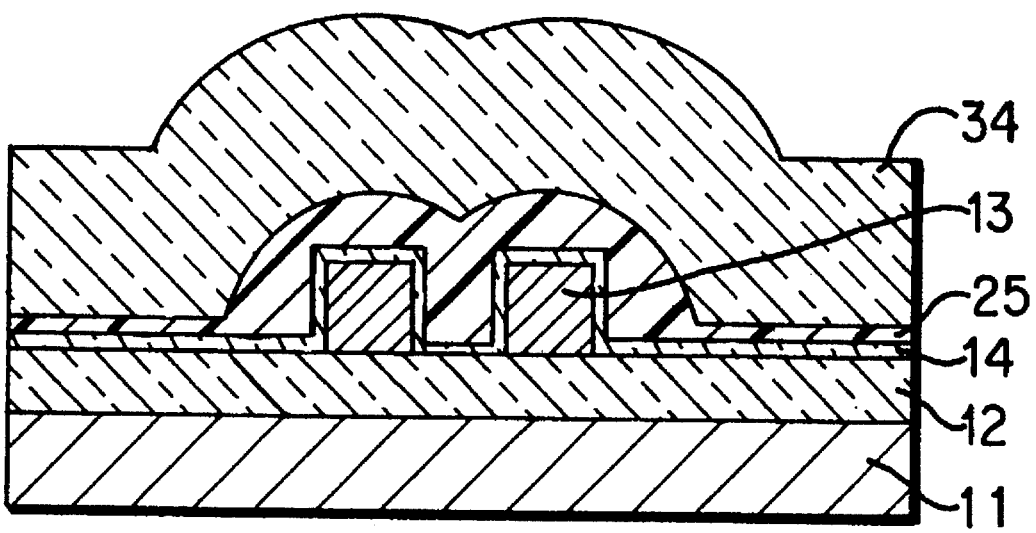

Then, a p-TEOS NSG film 34 is deposited on the ozone-TEOS NSG 25 so as to have film thickness of 1.7 μm at its planarized portion (FIG. 8*c*).

Figure 8D:
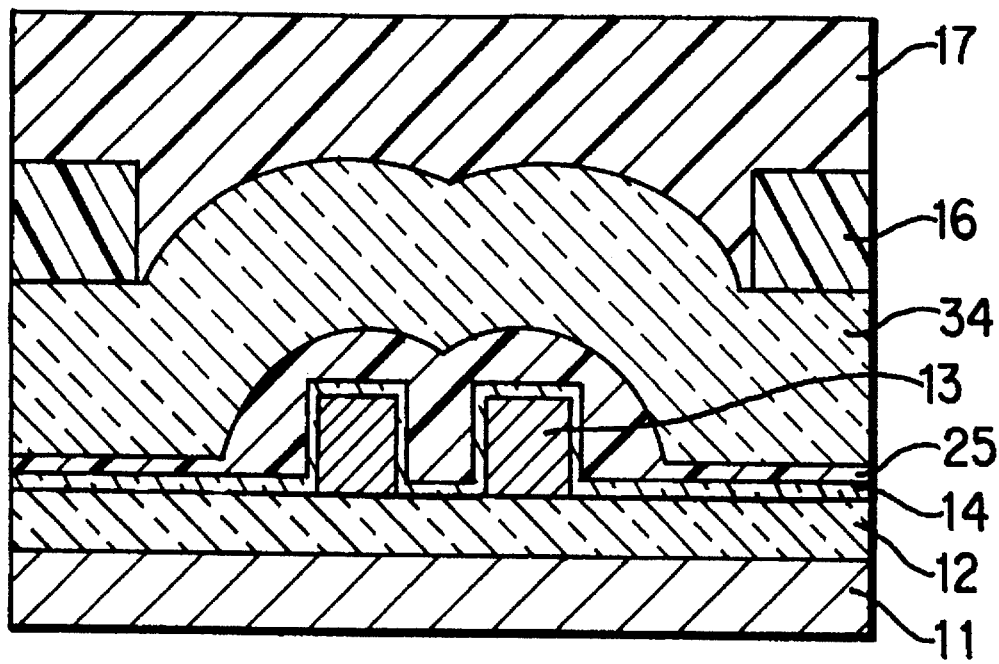

Then, a photoresist is applied onto whole surface of the p-TEOS NSG film 34 so as to have film thickness of 1.3 μm at its planarized portion and is subjected to exposure and development processes to form a dummy pattern 16 at the concave portion thereof, i.e., at the portion of the photoresist under which no aluminum wirings 13 is present. In this case, the thickness of the photoresist is made substantially equal to the step height at the surface of the p-TEOS NSG film 34. A photoresist 17 is then applied onto the whole surface of the thus formed wafer (FIG. 8*d*).

Figure 8E:
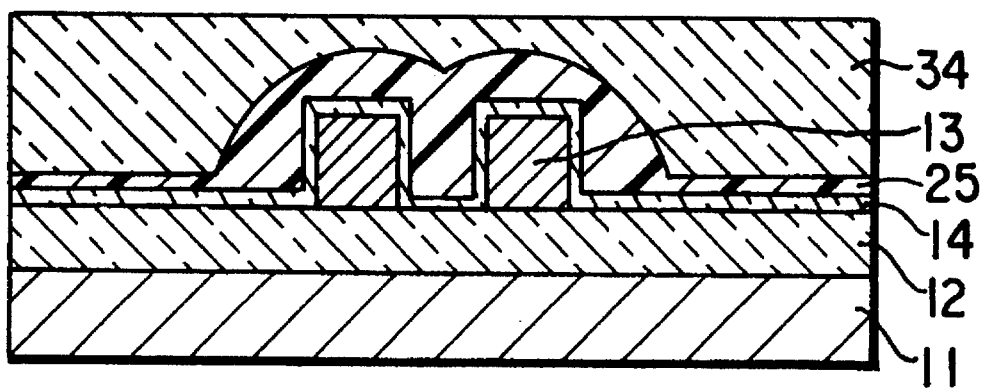

The thus obtained wafer is subjected to an etching back process under the condition that the p-TEOS NSG film 34 and the photoresist (16 and 17) are etched with the same etching speed, by utilizing a plasma etching using a gas atmosphere containing fluorine and oxygen, and thus a step of forming the interlayer insulating film is finished (FIG. 8*e*). The etching back is performed by setting the etching time so as to make a thickness of the p-TEOS NSG film 34 being 1.6 μm at its planarized portion.

According to this embodiment, the fabrication step becomes long as compared with that of the embodiment 7, but planarization capability of the surface of the interlayer insulating film can be increased.

Embodiment 9

Figure 9A:
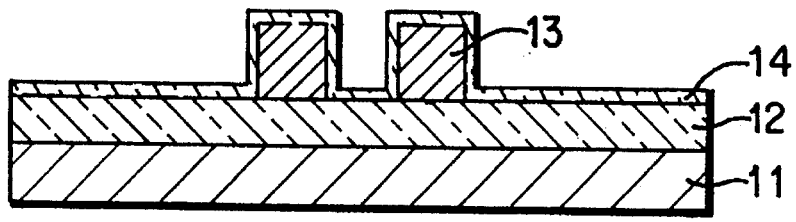
FIGS. 9a to 9d are cross sectional views showing ninth embodiment of the method according to the present invention.

In this embodiment, the steps of forming the aluminum wiring 13, and depositing the p-TEOS NSG film 14 are the same as the step of the embodiment 1 (FIG. 9*a*). Then, the p-TEOS NSG film 14 is subjected to a surface treatment by performing plasma process using $NH_3$. The conditions of the plasma treatment are as follows.

| | |
|---|---|
| $NH_3$ gas flow | 30 sccm |
| $N_2$ gas flow | 1000 sccm |
| Pressure | 0.35 torr |
| High frequency power | 1000 W |
| Temperature | 350° C. |
| Time | 60 sec |

Figure 9B:
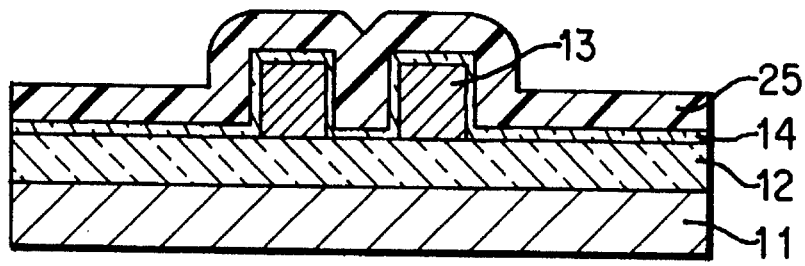

Next, an ozone-TEOS NSG film 25 is deposited on the thus formed substrate to a thickness of 500 nm. In this case, the ozone-TEOS NSG film 25 has the same thickness (500 nm) both on the wirings and on the planarized portion on which wirings are not provided (FIG. 9*b*). In this case, the ozone-TEOS NSG film can be filled completely between wirings having space of 0.5 μm.

Figure 9C:
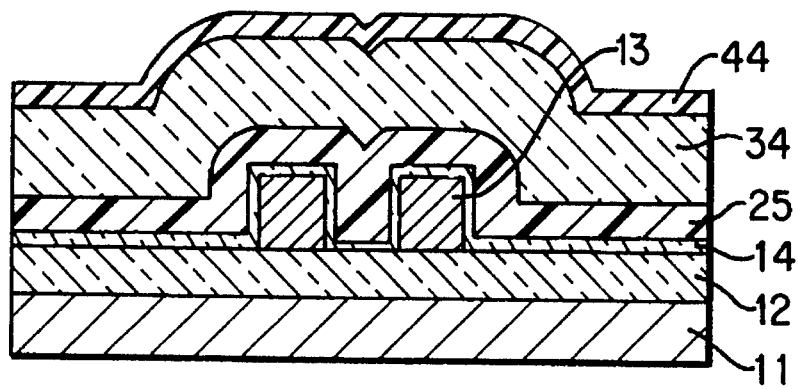

Then, a p-TEOS NSG film 34 having a thickness of 1 μm at the planarized portion thereof is deposited on the ozone-TEOS NSG film 25, and then a p-$SiH_4$ $SiO_2$ film 44 having a thickness of 0.2 μm at the planarized portion thereof is deposited on the p-TEOS NSG film 34 (FIG. 9*c*).

Figure 9D:
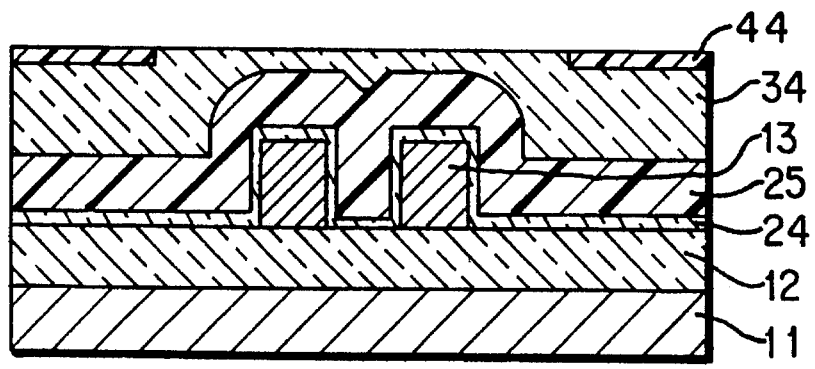

Then, the p-$SiH_4$ $SiO_2$ film 44 and the p-TEOS NSG film 34 which are placed on the convex portion of the substrate are etched back by CMP process. In this case, the p-$SiH_4$ $SiO_2$ film 44 having slow etching speed serves as an etching stop, thereby obtaining an planarized interlayer insulating film as shown in FIG. 9*d*.

Embodiment 10

Figure 10A:
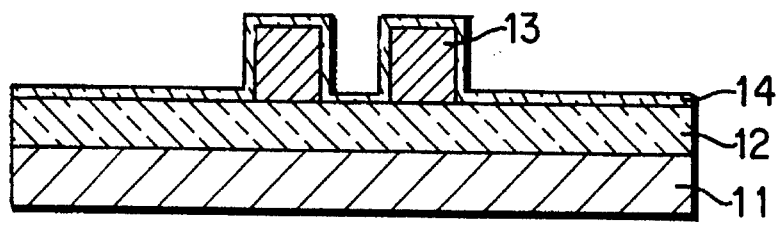
FIGS. 10a to 10d are cross sectional views showing tenth embodiment of the method according to the present invention.
Figure 10B:
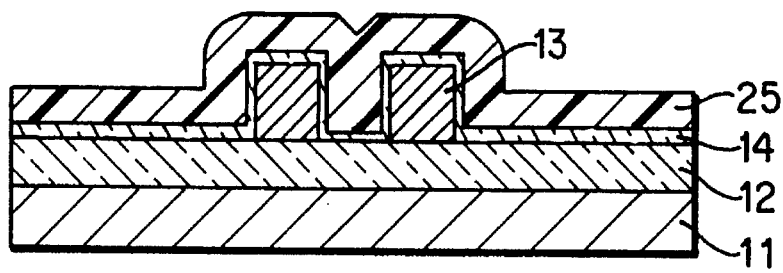

In this embodiment, the steps of forming the aluminum wiring 13, depositing the p-TEOS NSG film 14 (FIG. 10*a*), and depositing the ozone-TEOS NSG 25 by performing surface treatment of the p-TEOS NSG film 14 with $NH_3$ plasma treatment (FIG. 10*b*), are the same as the step of the embodiment 9.

Figure 10C:
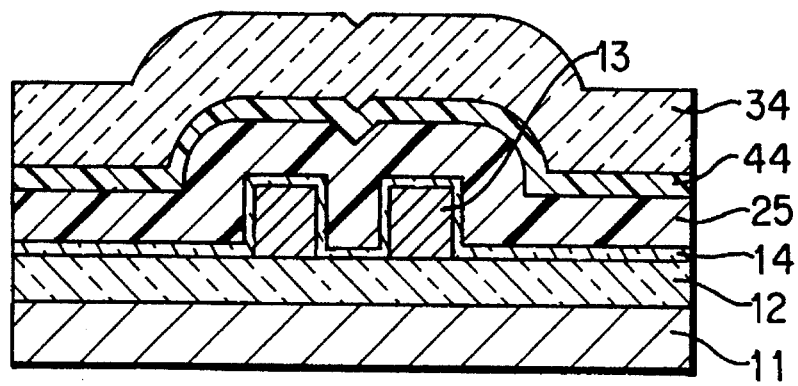

Then, a p-$SiH_4$ $SiO_2$ film 44 having a thickness of 0.2 μm at the planarized portion thereof is deposited on the ozone-TEOS NSG film 25, and then a p-TEOS NSG film 34 having a thickness of 1 μm at the planarized portion thereof is deposited on the p-$SiH_4$ $SiO_2$ film 44 (FIG. 10*c*).

Figure 10D:
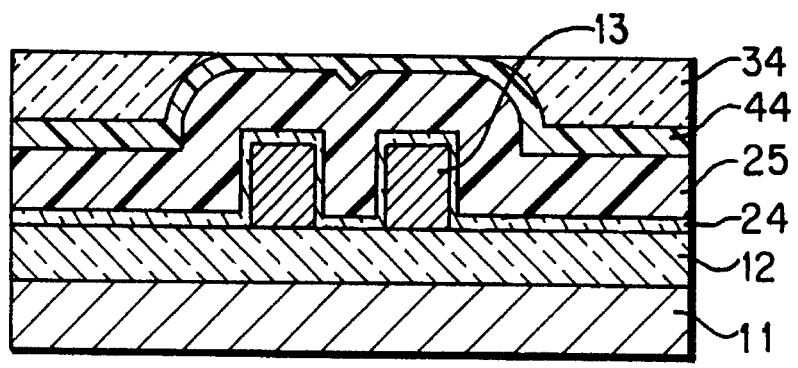

Then, the p-TEOS NSG film 34 which is placed on the convex portion of the substrate is etched back by CMP process. In this case, the p-$SiH_4$ $SiO_2$ film 44 having slow etching speed serves as an etching stop, and the etching back is stopped at the time that the portion of the p-$SiH_4$ $SiO_2$ film 44 placed on the aluminum wiring 13 is exposed, thereby obtaining an planarized interlayer insulating film as shown in FIG. 10*d*.

Embodiment 11

Figure 11A:
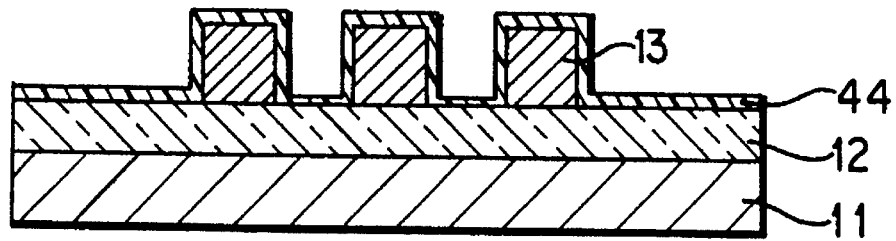
FIGS. 11a to 11d are cross sectional views showing eleventh embodiment of the method according to the present invention
Figure 11B:
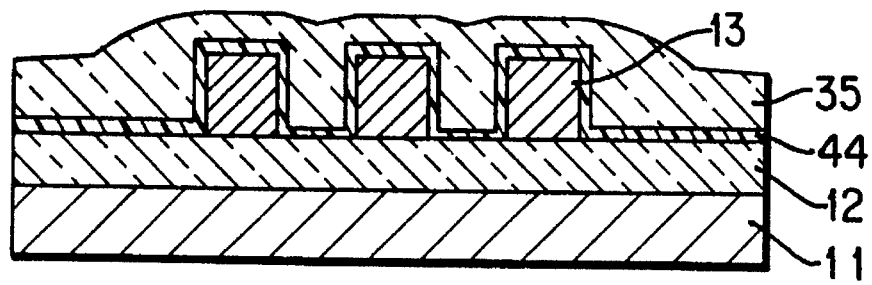
Figure 11C:
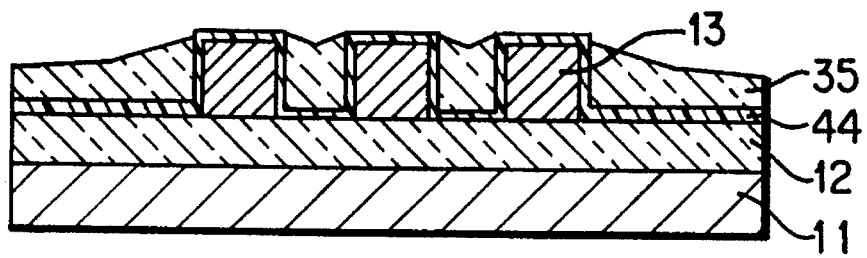
Figure 11D:
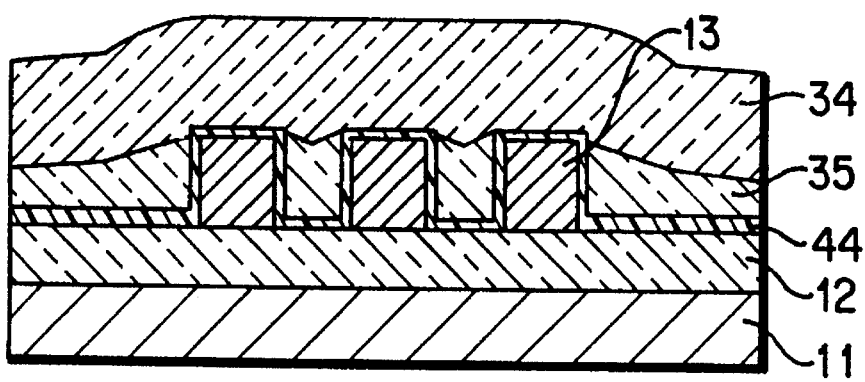

In this embodiment, the steps of forming an aluminum wiring 13, and depositing a p-$SiH_4$ $SiO_2$ film 44 are the same as the step of the embodiment 3 (FIG. 11*a*).

Then, an SOG film 35 is deposited on the p-$SiH_4$ $SiO_2$ film 44 so as to have film thickness of 0.6 μm at its planarized portion (FIG. 11(*b*)).

Then, the portion of the SOG film 35 placed on the convex portion, i.e., on the aluminum wirings 13 is etched back by CMP process. In this case, the etching speed of the SOG film 35 is near the etching speed of the p-TEOS NSG film, so that the SOG film 35 can be etched back with the same speed as that of the p-TEOS NSG film, while holding etching speed ratio to that of the p-$SiH_4$ $SiO_2$ film 44. Therefore, the p-$SiH_4$ $SiO_2$ film 44 is used as an etching stop in the same manner as in the case of the embodiment 3, so that as shown in FIG. 11(*c*), etching is performed to the portion of the SOG film 35 placed on the convex portion, i.e., on the aluminum wiring 13 and can be stopped at the time that the p-$SiH_4$ $SiO_2$ film 44 is exposed.

Finally, a p-TEOS NSG film 34 having a thickness of 0.8 μm is deposited, and thus a step of forming interlayer insulating film is finished (FIG. 11*e*).

What is claimed is:

1. A method of planarizing an insulating film comprising the steps of:

(a) preparing a semiconductor substrate;

(b) forming an insulating film on an uneven surface of the substrate by one of a chemical vapor deposition using an organic silicon compound as a raw material, coating a solution of an insulating substance on the uneven surface, and coating a solution of a precursor of an insulating substance on the uneven surface;

(c) forming a film having a chemical mechanical polishing etching speed slower than that of the insulating film by depositing one of silicon oxide and silicon oxynitride by performing a chemical vapor deposition using an inorganic silicon compound as a raw material; and (d) etching back at least a part of the insulating film formed on the uneven surface of the substrate by a chemical mechanical polishing process using the film having a slower chemical mechanical polishing etching speed as an etching stop.

2. A method as claimed in claim 1, wherein the insulating film is formed by a chemical vapor deposition using tetraethylorthosilicate as a raw material.

3. A method as claimed in claim 1, wherein the insulating film is formed by a chemical vapor deposition using tetraethylorthosilicate and ozone as a raw material.

4. A method as claimed in claim 1, wherein the film having a slower chemical mechanical polishing etching speed is formed between said uneven surface of said substrate and said insulating film.

5. A method as claimed in claim 1, wherein the film having a slower chemical mechanical polishing etching speed is formed over said insulating film.

6. A method as claimed in claim 1, wherein the step (a) comprises forming a laminated film by depositing the film having a slower chemical mechanical polishing etching speed on a conductive film and patterning the laminated film.

7. A method as claimed in claim 6, wherein the conductive film comprises at least one of Al, Cu and Au.

8. A method as claimed in claim 6, wherein the conductive film comprises polycrystalline silicon.

9. A method as claimed in claim 1, wherein the insulating film is a nondoped silicate glass film.

10. A method as claimed in claim 1, wherein the insulating film is formed by one of coating a solution of an insulating substance on the uneven surface, and coating a solution of a precursor of an insulating substance on the uneven surface.

11. A method as claimed in claim 1, wherein the substrate comprises a wiring comprising at least one of Al, Cu and Au.

12. A method as claimed in claim 1, wherein the film having the slower chemical mechanical polishing speed is formed by performing a plasma chemical vapor deposition.

13. A method as claimed in claim 1, wherein:

the step (b) further comprises treating the uneven surface of the substrate with an organic solvent; and the insulating film is formed on the thus-treated surface of the substrate by a chemical vapor deposition using an organic silicon compound as a raw material.

14. A method as claimed in claim 13, wherein the insulating film is formed by a chemical vapor deposition using tetraethylorthosilicate and ozone as a raw material.

15. A method as claimed in claim 14, wherein the organic solvent includes ethanol.

* * * * *